(12) United States Patent
Zhang (10) Patent No.: US 12,148,369 B2
(45) Date of Patent: Nov. 19, 2024

(54) DISPLAY PANEL WITH PIXEL DRIVING CIRCUIT LAYERS AND A CAPACITOR OVERLAPPED

(71) Applicant: WUHAN CHINA STAR OPTOELECTRONICS SEMICONDUCTOR DISPLAY TECHNOLOGY CO., LTD., Hubei (CN)

(72) Inventor: Le Zhang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,851

(22) PCT Filed: Dec. 21, 2021

(86) PCT No.: PCT/CN2021/139976
§ 371 (c)(1),
(2) Date: Jun. 22, 2023

(87) PCT Pub. No.: WO2023/108709
PCT Pub. Date: Jun. 22, 2023

(65) Prior Publication Data
US 2024/0038156 A1     Feb. 1, 2024

(30) Foreign Application Priority Data

Dec. 14, 2021   (CN) .......................... 202111526365.4

(51) Int. Cl.
*G09G 3/3225*     (2016.01)

(52) U.S. Cl.
CPC ... *G09G 3/3225* (2013.01); *G09G 2300/0426* (2013.01)

(58) Field of Classification Search
CPC ................... G09G 3/32; G09G 3/3225; G09G 2300/0426; G09G 3/3233;
(Continued)

(56) References Cited

U.S. PATENT DOCUMENTS

2018/0286307 A1* 10/2018 Kim ..................... G09G 3/3283

FOREIGN PATENT DOCUMENTS

| CN | 109742131 A | 5/2019 |
|---|---|---|
| CN | 110148610 A | 8/2019 |

(Continued)

OTHER PUBLICATIONS

International Search Report in International application No. PCT/CN2021/139976, mailed on Apr. 26, 2022.

(Continued)

*Primary Examiner* — Yaron Cohen
(74) *Attorney, Agent, or Firm* — PV IP PC; Wei Te Chung (57) ABSTRACT

A display panel including a pixel driving circuit is provided. The pixel driving circuit includes a first pixel driving circuit layer, a second pixel driving circuit layer, and a capacitor. The capacitor is electrically connected with a transistor of the first pixel driving circuit layer. The capacitor includes a first electrode plate. The second pixel driving circuit layer is arranged on the first electrode plate. At least one transistor of the second pixel driving circuit layer at least partially overlaps with the first electrode plate, so that the space occupied by the pixel driving circuit can be saved.

18 Claims, 6 Drawing Sheets

(58) Field of Classification Search
CPC ... G09G 2300/0819; G09G 2300/0861; G09G 2310/0251; G09G 2300/0842; H10K 59/1213; H10K 59/123; H10K 59/131; H10K 59/1216
See application file for complete search history.

(56) References Cited

FOREIGN PATENT DOCUMENTS

| | | |
|---|---|---|
| CN | 110895915 A | 3/2020 |
| CN | 111863892 A | 10/2020 |
| CN | 112420794 A | 2/2021 |
| CN | 112802873 A | 5/2021 |
| CN | 112863418 A | 5/2021 |
| CN | 114093898 A | 2/2022 |

OTHER PUBLICATIONS

Written Opinion of the International Search Authority in International application No. PCT/CN2021/139976, mailed on Apr. 26, 2022.
Chinese Office Action issued in corresponding Chinese Patent Application No. 202111526365.4 dated Feb. 10, 2023, pp. 1-9.

* cited by examiner

DISPLAY PANEL WITH PIXEL DRIVING CIRCUIT LAYERS AND A CAPACITOR OVERLAPPED

BACKGROUND OF INVENTION

1. Field of Invention

The invention relates to a technical field of displays, and more particularly, to a display panel.

2. Related Art

Improving the resolution of the display panel has long been a pursuit in the display panel industry, which suggests there is a need for designing smaller sized pixel units can further expand the applied fields of the display panel. For example, in AR, VR and other fields, there are high demands on the resolution of the display panel. In addition, in the fields of transparent display (which support both the display and perspective functions), there are strict restrictions on the area of opaque wiring areas of pixels. How to reduce the pixel unit area and make the display panel be applied in the high resolution or high light-transmittance display fields is a topic worthy of study.

At present, one of the trendy display panels is the low temperature poly-silicon active-matrix organic light emitting diode (LTPS-AMOLED) panel, and LTPS-AMOLED sub-pixel driving circuits are basically driving circuits with compensation function. So far, the LTPS-AMOLED sub-pixel driving circuit with compensation function is of 7T1C (7 TFTs, 1 capacitor) design. Because the capacitor of 7T1C driving circuit is constantly in the voltage-holding stage, the capacitance will leak continuously. In order to reduce the problem of capacitance leakage, there is a requirement for the capacitor capacity, that is, the larger the area of capacitor plate, the better the capacitor capacity. In this sense, the capacitor plate in the 7T1C circuit occupies a relatively large area. In addition, the wirings of the substrate sub-pixel driving circuit and the TFTs all need to occupy a certain amount of area. The pixel unit area of the LTPS-AMOLED panel depends mostly on the area of the driving circuit. At present, the driving substrate circuitry of the LTPS-AMOLED panel is already extremely dense, and thus the area thereof cannot be further reduced.

SUMMARY OF INVENTION

Embodiments of the invention provide a display panel to solve the technical problem that the area of the pixel unit cannot be further reduced due to the excessive occupation of the driving circuit area of the existing display panel, which limits the development of the display panel to high resolution.

To solve the above problems, the technical solutions provided by the present invention are as follows.

An embodiment of the invention provides a display panel, comprising a plurality of light emitting units; and a plurality of pixel driving circuits for driving the plurality of light emitting units to emit light, comprising: a first pixel driving circuit layer comprising at least one transistor; a capacitor electrically connected to the at least one transistor of the first pixel driving circuit layer, and comprising a first electrode plate electrically connected to a first voltage line; a second pixel driving circuit layer arranged on the capacitor, wherein the second pixel driving circuit layer comprises at least one transistor. An orthogonal projection of said at least one transistor of the second pixel driving circuit layer on the first electrode plate at least partially overlaps with the first electrode plate; gates of transistors of the second pixel driving circuit layer are arranged on the first electrode plate, and at least some of the gates of the transistors of the second pixel driving circuit layer are electrically connected to a signal line; and the first electrode plate comprises vias through which some of the transistors of the second pixel driving circuit layer are electrically connected with corresponding transistors of the first pixel driving circuit layer.

In some embodiments of the present invention, the first pixel driving circuit layer comprises a first transistor, and the display panel comprises a first semiconductor layer, a first metal layer, a second metal layer, and a second semiconductor layer arranged in different layers; wherein the first semiconductor layer comprises a first active portion of the transistor of the first pixel driving circuit layer; the second semiconductor layer comprises a second active portion of the transistor of the second pixel driving circuit layer; the first metal layer comprises a gate of the first transistor, and the gate of the first transistor doubles as the second electrode plate of the capacitor; and the second metal layer comprises a first electrode plate, wherein an orthogonal projection of the gate on a horizontal plane at least partially overlaps with an orthogonal projection of the first electrode plate on the horizontal plane; and wherein the orthogonal projection of the gate on the horizontal plane overlaps with an orthogonal projection of the second active portion on the horizontal plane, and/or the orthogonal projection of the first electrode plate on the horizontal plane partially overlaps with the orthogonal projection of the second active portion on the horizontal plane.

In some embodiments of the present invention, the orthogonal projection of the second active portion on the horizontal plane is within the orthogonal projection of the gate on the horizontal plane, and/or the orthogonal projection of the second active portion on the horizontal plane is within the orthogonal projection of the first electrode plate on the horizontal plane.

In some embodiments of the present invention, an orthogonal projection of the first semiconductor layer on the horizontal plane partially overlaps with an orthogonal projection of the second semiconductor layer on the horizontal plane.

An embodiment of the present invention further provides another display panel, comprising a plurality of light emitting units; and a plurality of pixel driving circuits for driving the plurality of light emitting units to emit light, the pixel driving circuits comprising a first pixel driving circuit layer comprising at least one transistor; a capacitor electrically connected to the at least one transistor of the first pixel driving circuit layer, and comprising a first electrode plate electrically connected to a first voltage line; and a second pixel driving circuit layer arranged on the capacitor and electrically connected with the first pixel driving circuit layer. The second pixel driving circuit layer comprises at least one transistor. An orthogonal projection of said at least one transistor of the second pixel driving circuit layer on the first electrode plate at least partially overlaps with the first electrode plate.

In some embodiments of the present invention, the first pixel driving circuit layer comprises a first transistor, and the display panel comprises a first semiconductor layer, a first metal layer, a second metal layer, and a second semiconductor layer arranged in different layers wherein the first semiconductor layer comprises a first active portion of the transistor of the first pixel driving circuit layer; the second semiconductor layer comprises a second active portion of the transistor of the second pixel driving circuit layer; the first metal layer comprises a gate of the first transistor, and the gate of the first transistor doubles as the second electrode plate of the capacitor; and the second metal layer comprises the first electrode plate, wherein an orthogonal projection of the gate on a horizontal plane at least partially overlaps with an orthogonal projection of the first electrode plate on the horizontal plane; and wherein the orthogonal projection of the gate on the horizontal plane partially overlaps with an orthogonal projection of the second active portion on the horizontal plane, and/or the orthogonal projection of the first electrode plate partially overlaps with the orthogonal projection of the second active portion on the horizontal plane.

In some embodiments of the present invention, the orthogonal projection of the second active portion on the horizontal plane is within the orthogonal projection of the gate on the horizontal plane, and/or the orthogonal projection of the second active portion on the horizontal plane is within the orthogonal projection of the first electrode plate on the horizontal plane.

In some embodiments of the present invention, an orthogonal projection of the first semiconductor layer on the horizontal plane partially overlaps with an orthogonal projection of the second semiconductor layer on the horizontal plane.

In some embodiments of the present invention, the first electrode plate comprises a via through which some of the transistors of the second pixel driving circuit layer are electrically connected with corresponding transistors of the first pixel driving circuit layer.

In some embodiments of the present invention, the display panel further comprises a first conversion line, wherein the first conversion line electrically connects, through the via, one of the source and drain of some of the transistors of the second pixel driving circuit layer to one of the source and drain of the corresponding transistors of the first pixel driving circuit layer.

In some embodiments of the present invention, a gate of the transistor of the second pixel driving circuit layer is arranged on the first electrode plate, and at least some of the gates of the transistors of the second pixel driving circuit layer are electrically connected to a same signal line.

In some embodiments of the present invention, an orthogonal projection of the signal line electrically connecting to the gates of the transistors of the second pixel driving circuit layer on the first electrode plate partially overlaps with the first electrode plate.

In some embodiments of the present invention, the pixel driving circuit further comprises a second transistor, a third transistor, a fourth transistor, a fifth transistor, a sixth transistor, and a seventh transistor, wherein both the gate of the second transistor and a gate of the third transistor receive a first driving signal, both a gate of the fourth transistor and a gate of the seventh transistor receive a second driving signal, both a gate of the fifth transistor and a gate of the sixth transistor receive a third driving signal, wherein one of the source and drain of the second transistor is electrically connected to a first voltage line, the drain of the second transistor is electrically connected between one of the source and drain of the fifth transistor and one of the source and drain of the first transistor, the first electrode plate is electrically connected between the first voltage line and the other of the source and drain of the fifth transistor, one of the source and drain of the third transistor is electrically connected between one of the source and drain of the fourth transistor and the gate of the first transistor, the other of the source and drain of the third transistor is electrically connected between the other of the source and drain of the first transistor and one of the source and drain of the sixth transistor, the other of the source and drain of the sixth transistor is electrically connected between an anode of one of the light emitting units and one of the source and drain of the seventh transistor, and one of the source and drain of the fourth transistor is electrically connected between a third voltage line and the other of the source and drain of the seventh transistor.

In some embodiments of the present invention, the first active portion comprises an active portion of the first transistor, an active portion of the fourth transistor, and an active portion of the seventh transistor, and the second active portion comprises an active portion of the second transistor, an active portion of the third transistor, an active portion of the fifth transistor, and an active portion of the sixth transistor.

In some embodiments of the present invention, each of the orthogonal projections of the active portion of the second transistor on the horizontal plane, the active portion of the third transistor on the horizontal plane, the active portion of the fifth transistor on the horizontal plane, and the active portion of the sixth transistor on the horizontal plane at least partially overlaps with the orthogonal projection of the gate on the horizontal plane; and/or each of the orthogonal projections of the active portion of the second transistor, the active portion of the third transistor, the active portion of the fifth transistor, and the active portion of the sixth transistor on the horizontal plane overlaps at least partially with the orthogonal projection of the first electrode plate on the horizontal plane.

In some embodiments of the present invention, the first metal layer comprises a first signal line for transmitting the second driving signal, the second metal layer comprises the third voltage line, the display panel comprises a third metal layer, and the third metal layer comprises a second signal line for transmitting the first driving signal and a third signal line for transmitting the third driving signal.

In some embodiments of the present invention, the first active portion comprises the active portion of the first transistor, the active portion of the second transistor, the active portion of the third transistor, the active portion of the fifth transistor, and the active portion of the sixth transistor; and the second active portion comprises the active portion of the fourth transistor and the active portion of the seventh transistor.

In some embodiments of the present invention, both the orthogonal projection of the active portion of the fourth transistor on the horizontal plane and the orthogonal projection of the active portion of the seventh transistor on the horizontal plane at least partially overlap with the orthogonal projection of the gate on the horizontal plane, and/or both the orthogonal projection of the active portion of the fourth transistor on the horizontal plane and the orthogonal projection of the active portion of the seventh transistor on the horizontal plane at least partially overlap with the orthogonal projection of the first electrode plate on the horizontal plane.

In some embodiments of the present invention, the orthogonal projection of the second semiconductor layer on the horizontal plane is within the orthogonal projection of the gate on the horizontal plane, and/or the orthogonal projection of the second semiconductor layer on the horizontal plane is within the orthogonal projection of the first electrode plate on the horizontal plane.

In some embodiments of the present invention, the first metal layer includes a second signal line for transmitting the first driving signal, and a third signal line for transmitting the third driving signal; the display panel includes a third metal layer, and the third metal layer includes the first signal line for transmitting the second driving signal.

The present application has advantageous effects as follows: the embodiment of the invention provides a display panel, which includes a plurality of light-emitting units and a plurality of pixel driving circuits for driving the light-emitting units to emit light. The pixel driving circuits include a first pixel driving circuit layer, a second pixel driving circuit layer, and a capacitor which are arranged in different layers. Each of the first pixel driving circuit layer and the second pixel driving circuit layer includes at least one transistor. The capacitor is electrically connected with one of the transistors of the first pixel driving circuit layer, and includes a first electrode plate electrically connected with a first voltage line. The second pixel driving circuit layer is arranged on the first electrode plate, and the orthogonal projection of the transistor of the second pixel driving circuit layer on the first electrode plate at least partially overlaps with the first electrode plate. The display panel not only saves the space occupied by the pixel driving circuit, but also shields crosstalk between transistors in upper and lower layers.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The technical solutions in the embodiments of the present application will be clearly and completely described in the following with reference to the accompanying drawings in the embodiments. Apparently, the embodiments as described are only a part, but not all, of the embodiments of the present application. Based on the embodiments in the present application, all other embodiments acquired by those skilled in the art without creative efforts shall be within the scope of the present application.

In the description of this application, it should be understood that the azimuth or positional relationship indicated by the terms "upper", "lower", and "horizontal plane" is based on the azimuth or positional relationship shown in the drawings, only for better understanding of the application and simplification of illustration, and does not indicate or imply that the indicated device or element must have a specific orientation, be constructed and operated in a specific orientation, so it cannot be understood as a limitation of this application. In addition, the terms "first" and "second" are only used for descriptive purposes, and shall not be understood as indicating or implying relative importance or implicitly indicating the number of indicated technical features. Thus, the features defined by "first" and "second" may explicitly or implicitly include one or more of the features. In the description of this application, the term "plural" or "a plurality of" means two or more than two, unless otherwise specifically defined.

In this application, unless otherwise specified and limited, "a first feature above/or below" may include the direct contact between the first and second features, or indirect contact between the first and second features through another feature therebetween instead of direct contact.

Aiming at solving the technical problem of the conventional display panel that the pixel unit area cannot be further reduced due to the excessive area occupation of the pixel driving circuit that interferes the development of the display panel to reaching high resolution, the present embodiment is proposed to overcome this problem.

Figure 1:
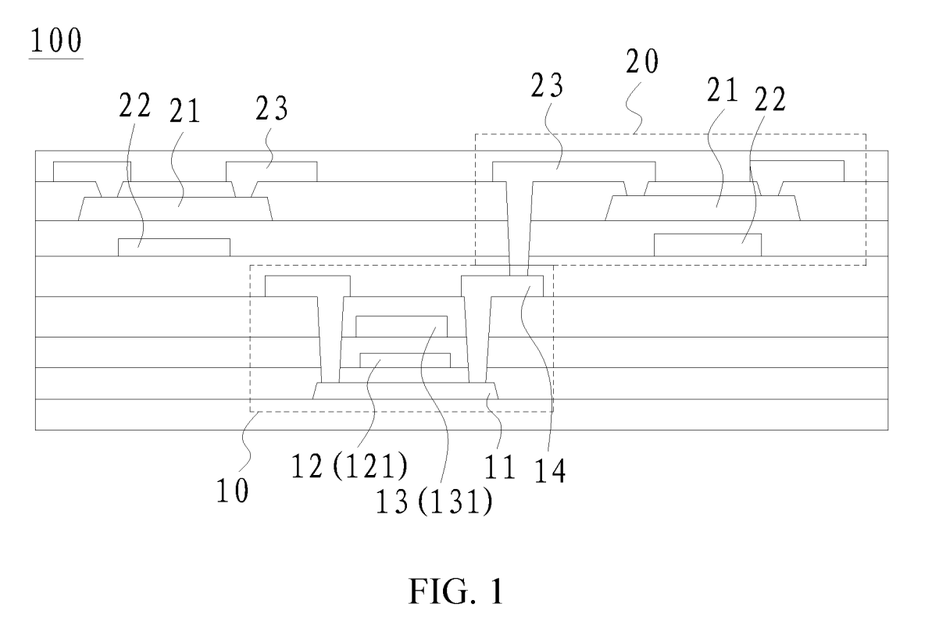
FIG. 1 is a diagram illustrating a cross-sectional view of a display panel according to an embodiment of the present invention.

Please refer to FIG. 1, which is a diagram illustrating a cross-sectional view of a display panel 100 according to an embodiment of the present invention. The display panel 100 includes a plurality of light emitting units and a plurality of pixel driving circuits, wherein the pixel driving circuits are configured for driving the light emitting units to emit light. The light-emitting units of the embodiment of the present invention can be an OLED light-emitting units, each including an organic electroluminescent diode. The light-emitting units can also be Micro-LED light-emitting units or a Mini-LED light-emitting units, etc. The pixel driving circuit includes several transistors, each including portions such as an active portion, the gate, a source electrode, a drain electrode, etc. The transistors are distributed in at least two layers, so that transistors of different layers can have overlapping surfaces, so as to reduce the area occupied by the driving circuit in a single plane.

Figure 5:
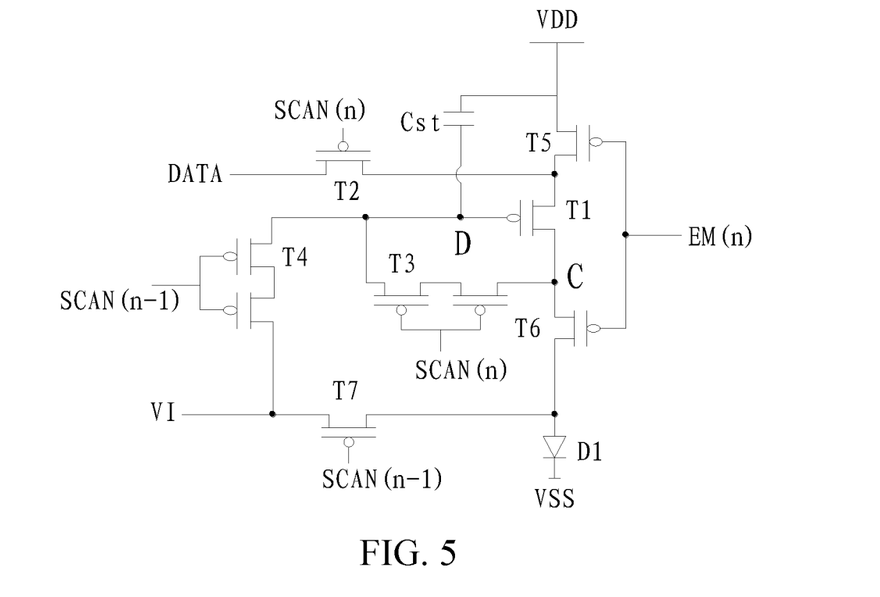
FIG. 5 is a diagram illustrating a pixel driving circuit according to an embodiment of the present invention.

Specifically, referring to FIGS. 1 and 5, the pixel driving circuit includes a first pixel driving circuit layer 10, a second pixel driving circuit layer 20, and a capacitor Cst. The first pixel driving circuit layer 10 and the second pixel driving circuit layer 20 are electrically connected and arranged in different layers. Each the first pixel driving circuit layer 10 and the second pixel driving circuit layer 20 includes at least one transistor. The capacitor Cst is electrically connected to a transistor of the first pixel driving circuit layer 10, and includes a first electrode plate 131 electrically connected to the first voltage line VDD. The second pixel driving circuit layer 20 is arranged on the capacitor Cst. The orthogonal projection of at least one transistor of the second pixel driving circuit layer 20 on the first electrode plate 131 at least partially overlaps with the first electrode plate 131.

By arranging some transistors of the pixel driving circuit on the first electrode plate 131 of the capacitor Cst, and overlapping at least one of these transistors with the first electrode plate 131, the wiring space occupied by the pixel driving circuit can be saved, and the crosstalk between the transistors of the upper and lower layers can be shielded. When oxide transistors are used in the upper layer, it can also improve the influence of hydrogen in the lower layer transistor on the performance of the upper layer oxide transistors.

Figure 2:
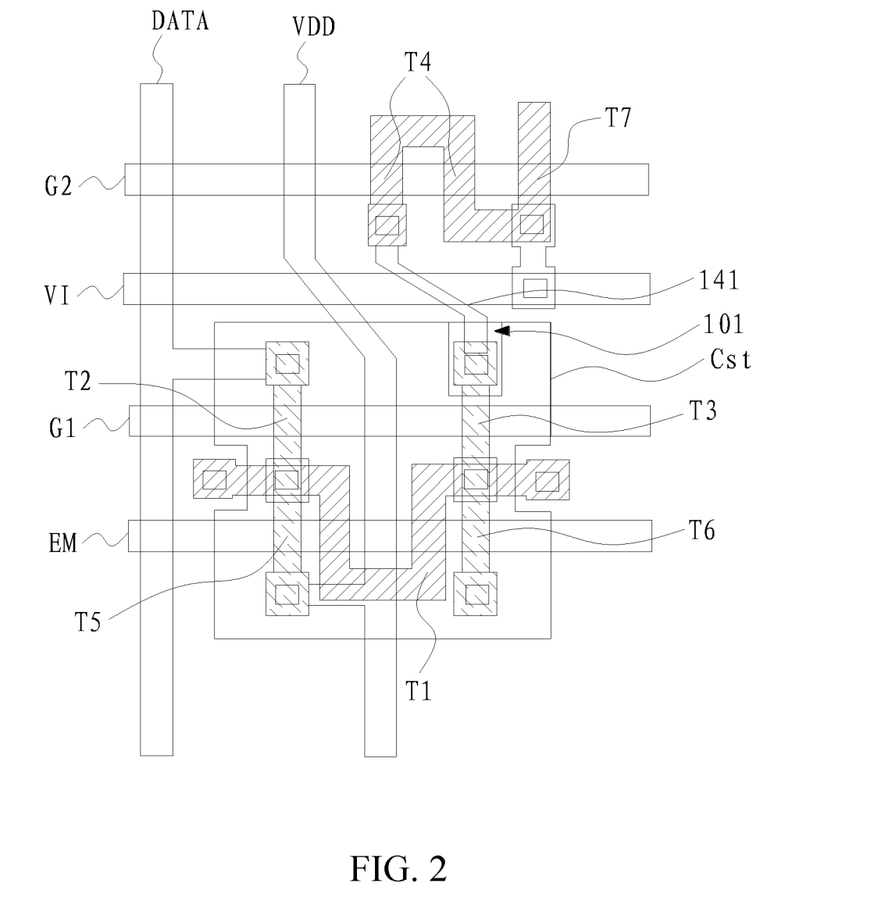
FIG. 2 is a diagram illustrating a plan view of a pixel driving circuit of a display panel according to an embodiment of the present invention.
Figure 3:
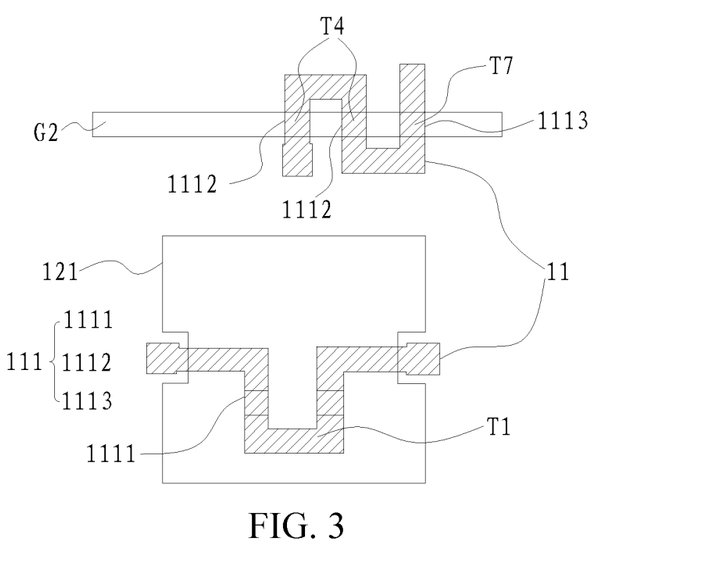
FIG. 3 is a diagram illustrating a plan view of part of film layers of a display panel according to an embodiment of the present invention.
Figure 4:
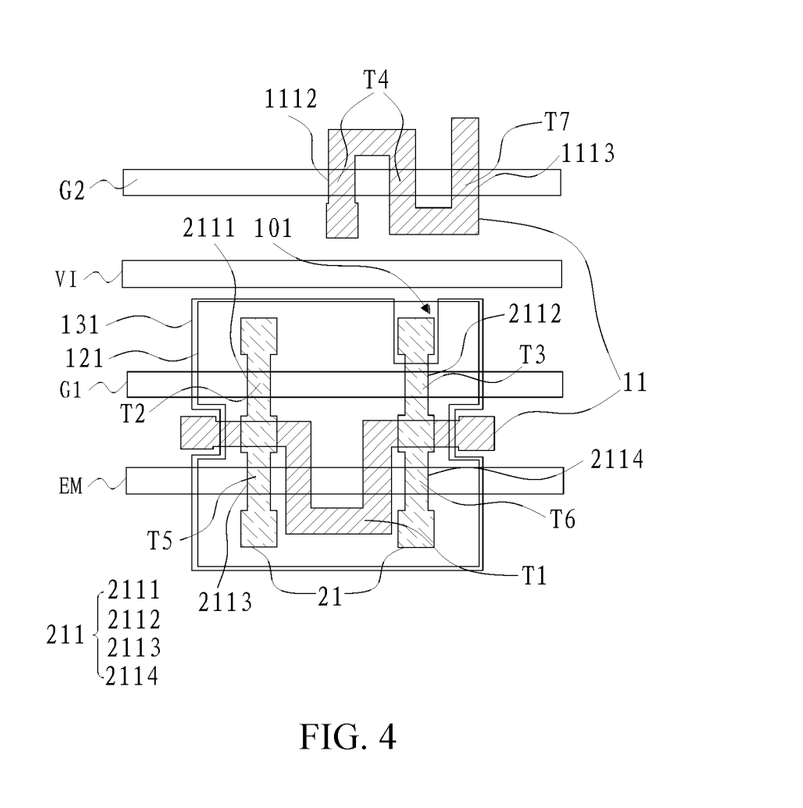
FIG. 4 is a diagram illustrating a plan view of part of film layers of a display panel according to another embodiment of the present invention.

Please refer to FIG. 1 to FIG. 4. FIG. 2 is a diagram illustrating a plan view of a pixel driving circuit of a display panel according to an embodiment of the present invention. FIG. 3 is a diagram illustrating a plan view of part of film layers of a display panel according to an embodiment of the present invention. FIG. 4 is a diagram illustrating a plan view of part of film layers of a display panel according to another embodiment of the present invention. The first pixel driving circuit layer 10 in the embodiment of the present invention includes a first transistor T1, which can be a driving transistor. The display panel 100 includes a first semiconductor layer 11, a first metal layer 12, a second metal layer 13, and a second semiconductor layer 21 arranged in different layers.

The first semiconductor layer 11 includes first active portions 111 of the transistors of the first pixel driving circuit layer 10, that is, the first semiconductor layer 11 is used to form the active portion of each transistor of the first pixel driving circuit layer 10. The second semiconductor layer 21 includes second active portions 211 of the transistors of the second pixel driving circuit layer 20, that is, the second semiconductor layer 21 is used to form the active portion of each transistor of the second pixel driving circuit layer 20. The first metal layer 12 includes the gate 121 of the first transistor T1, and the second metal layer 13 includes the first electrode plate 131. The orthogonal projection of the gate 121 of the first transistor T1 on the horizontal plane at least partially overlaps with the orthogonal projection of the first electrode plate 131 on the horizontal plane, that is, the gate 121 of the first transistor T1 and the first electrode plate 131 overlap in the thickness direction of the display panel 100. The gate 121 of the first transistor T1 is also used to form the second electrode plate of the capacitor Cst, and the gate 121 and the first electrode plate 131 form the capacitor Cst of the pixel driving circuit. In order to keep the capacitor constantly in the voltage-holding stage when the pixel driving circuit works normally, a larger area the gate 121 of the first transistor T1 overlaps with the first electrode plate 131 is preferred.

Referring to FIG. 3 and FIG. 4, since the active portions of the transistors of the pixel driving circuit are arranged in at least two layers in this embodiment, i.e., the first active portion 111 and the second active portion 211 in different layers, the active portion of the upper layer can overlap with the gate 121 and/or the first electrode plate 131 in the lower layer. That is, the orthogonal projection of the gate 121 of the first transistor T1 on the horizontal plane partially overlaps with the orthogonal projection of the second active portion 211 on the horizontal plane, and/or the orthogonal projection of the first electrode plate 131 on the horizontal plane partially overlaps with the orthogonal projection of the second active portion 211 on the horizontal plane.

In a conventional pixel driving circuit, except for the two electrode plates of the capacitor partially overlapping with the active layers that drives transistors, the active layers of the rest of the transistors are all arranged outside said two electrode plates, resulting in an overall larger plane area being occupied by the pixel driving circuit. Comparatively, in this embodiment of the present invention, some transistors of the pixel driving circuit are moved to other layers, making active portions of some transistors overlap with the two electrode plates of the capacitor Cst (i.e., the gate 121 and the first electrode plate 131), thus reducing the space occupied by some transistors can be reduced, thereby reducing the plane area occupied by the entire pixel driving circuit. In addition, the first electrode plate 131 can also shield the crosstalk between upper and lower transistors. Referring to FIG. 2, the gates of the transistors of the second pixel driving circuit layer 20 are arranged on the first electrode plate 131, and at least some of the gates of the transistors of the second pixel driving circuit layer 20 are electrically connected to the same signal line. That is, the transistors connected to the same signal line are arranged above the first electrode plate 131, thus further saving wiring space. Further, the orthogonal projection of the signal line electrically connecting the gates of the transistors of the second pixel driving circuit layer 20 on the first electrode plate 131 partially overlaps with the first electrode plate 131, that is, the signal line connecting the transistors of the second pixel driving circuit layer 20 may overlap with the first electrode plate 131.

Please refer to FIG. 5, which is a diagram illustrating a pixel driving circuit according to an embodiment of the present invention. The pixel driving circuit of the embodiment of the present invention is illustrated taking the circuit architecture of 7T1C (7 transistors, 1 capacitor) as an example, but it can be understood that the pixel driving circuit of the embodiment of the present invention can also be implemented in other types of circuitry, such as 3T1C. The pixel driving circuit includes a second transistor T2, a third transistor T3, a fourth transistor T4, a fifth transistor T5, a sixth transistor T6, and a seventh transistor T7. The gate of the second transistor T2 and the gate of the third transistor T3 receive the same first driving signal Scan(n), and the gate of the fourth transistor T4 and the gate of the seventh transistor T7 receive the same second driving signal Scan(n−1). The gate of the fifth transistor T5 and the gate of the sixth transistor T6 receive the same third driving signal EM(n). One of the source and drain of the second transistor T2 is electrically connected to the second voltage line DATA, and the other of the source and drain of the second transistor T2 is electrically connected between one of the source and drain of the fifth transistor T5 and one of the source and drain of the first transistor T1. The first electrode plate 131 is electrically connected between the first voltage line VDD and the other of the source and drain of the fifth transistor T5. One of the source and drain of the third transistor T3 is electrically connected between one of the source and drain of the fourth transistor T4 and the gate 121 of the first transistor T1. The other of the source and drain of the third transistor T3 is electrically connected between the other of the source and drain of the first transistor T1 and one of the source and drain of the sixth transistor T6. The other of the source and drain of the sixth transistor T6 is electrically connected between the anode of the light emitting unit D1 and one of the source and drain of the seventh transistor T7. The other of the source and drain of the fourth transistor T4 is electrically connected between the third voltage line VI and the other of the source and drain of the seventh transistor T7.

According to the embodiment of the present invention, the second transistor T2 can be a switching transistor, the third transistor T3 can be a compensation transistor, the fourth transistor T4 can be an initialization transistor, the fifth transistor T5 can be a first light-emitting control transistor, the sixth transistor T6 can be a second light-emitting control transistor, and the seventh transistor T7 can be an anode reset transistor. Each transistor of the pixel driving circuit can be a P-type transistor, and the third transistor T3 and the fourth transistor T4 can be dual-gate transistors or single-gate transistors. The first driving signal Scan(n) can be the nth scanning signal, the second driving signal Scan (n−1) can be the (n−1)th scanning signal, the third driving signal EM(n) can be the nth lighting control signal, the second voltage line DATA can be a data line, the first voltage line VDD can be a DC power line, and the third voltage line VI can be the initialization voltage line.

Figure 6:
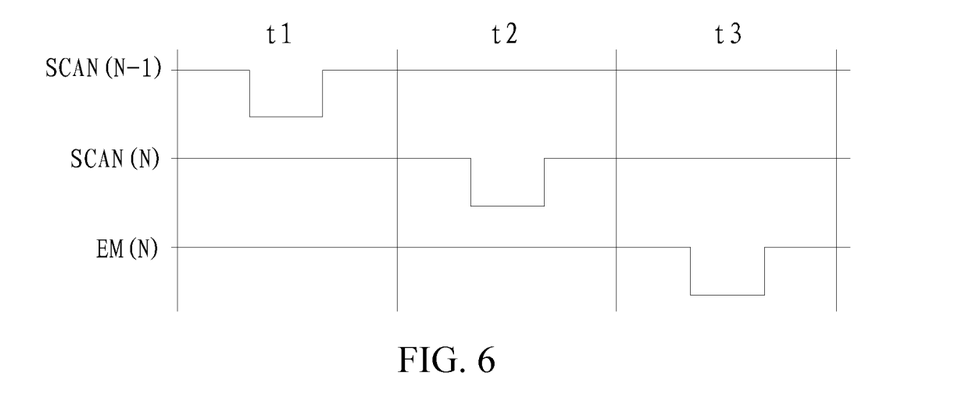
FIG. 6 is a timing diagram of the operation of the pixel driving circuit of the present invention.

Please refer to FIG. 6, which is a timing diagram of the operation of the pixel driving circuit of the present invention. The operation stages of the pixel driving circuit can be divided into following three stages: an initial restoration stage t1, circuit compensation stage t2, and light-emitting stage t3. In the initial restoration stage t1, Scan(n−1) is at low level. When the fourth transistor T4 and the seventh transistor T7 are turned on, the gate 121 of the first transistor T1 is reset to the initial voltage, and the anode of the light emitting unit D1 is reset to the initial voltage. In the circuit compensation stage t2: Scan(n) is at low level, the second transistor T2 and the third transistor T3 are turned on, the gate 121 of the first transistor T1 is charged to Vdata-Vth, wherein Vdata is the voltage transmitted by the data line, and Vth is the threshold voltage. In the light-emitting stage t3: EM (n) is at low level, the fifth transistor T5 and the sixth transistor T6 are turned on, and the light emitting unit D1 emits light.

Referring to FIGS. 1 and 2. In some embodiments of the present invention, the second transistor T2, the third transistor T3, the fifth transistor T5, and the sixth transistor T6 are arranged in layers different from that of the first transistor T1, and are moved to the second pixel driving circuit 20, while the fourth transistor T4 and the seventh transistor T7 can remain in the first pixel driving circuit layer 10. That is, the second pixel driving circuit layer 20 includes the second transistor T2, the third transistor T3, the fifth transistor T5, and the sixth transistor T6, and the first pixel driving circuit layer 10 includes the fourth transistor T4 and the seventh transistor T7.

Specifically, referring to FIG. 3. The first active portion 111 includes the active portion 1111 of the first transistor T1, the active portion 1112 of the fourth transistor T4, and the active portion 1113 of the seventh transistor T7. Referring to FIG. 4, the second active portion 211 includes the active portion 2111 of the second transistor T2, the active portion 2112 of the third transistor T3, the active portion 2113 of the fifth transistor T5 and the active portion 2114 of the sixth transistor T6. The active portion 1112 of the fourth transistor T4 is connected with the active portion 1113 of the seventh transistor T7, the active portion 2111 of the second transistor T2 is connected with the active portion 2113 of the fifth transistor T5, and the active portion 2112 of the third transistor T3 is connected with the active portion 2114 of the sixth transistor T6.

Referring to FIG. 4, the active portion 2111 of the second transistor T2, the active portion 2112 of the third transistor T3, the active portion 2113 of the fifth transistor T5, and the active portion 2114 of the sixth transistor T6 all overlap between the gate 121 of the first transistor T1 and the first electrode plate 131. That is, each of the orthogonal projection of the active portion 2111 of the second transistor T2 on the horizontal plane, the orthogonal projection of the active portion 2112 of the third transistor T3 on the horizontal plane, the orthogonal projection of the active portion 2113 of the fifth transistor T5 on the horizontal plane, and the orthogonal projection of the active portion 2114 of the sixth transistor T6 on the horizontal plane T6 at least partially overlaps between the orthogonal projection of the gate 121 of the first transistor T1 on the horizontal plane and the orthogonal projection of the first electrode plate 131 on the horizontal plane.

The active portion of the transistor mentioned in this embodiment of the present invention refers to the part where the semiconductor layer where the active portion is located overlaps with the gate of the transistor, that is, the part where the two elements overlap in the thickness direction of the display panel 100, i.e., the part where the semiconductor layer is shielded by the gate of the transistor. For example, as shown in FIG. 3, the active portion 1111 of the first transistor T1 refers to the portion where the first semiconductor layer 11 overlaps with the gate 121 of the first transistor T1. The electrical connection between the source and drain of different transistors is realized by connecting the corresponding active portions with the corresponding semiconductor layer of the lower layer.

Figure 7:
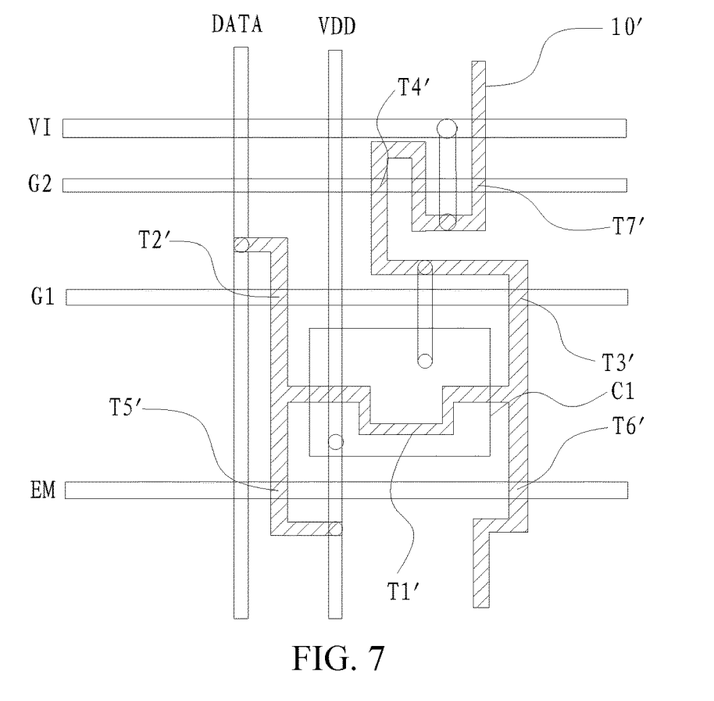
FIG. 7 is a diagram illustrating a plan view of a conventional 7T1C pixel driving circuit.

Please refer to FIG. 7, which is a diagram illustrating a plan view of a conventional 7T1C pixel driving circuit that includes the transistors T1', T2', T3', T4', T5', T6', T7', and capacitor C1). The active layer 10' of each transistor of the prior art pixel driving circuit is obtained by patterning the same semiconductor layer. In order to reduce the capacitance leakage problem, there is restriction on the capacitance capacity, and thus the area occupied by the two electrode plates of the capacitor C1 in the pixel driving circuit is large, resulting in that the area of the electrode plates cannot be further reduced. The transistor faced by the two electrode plates is the driving transistor T1'. The switching transistor T2', the compensation transistor T3', the first light-emitting control transistor T5' and the second light-emitting control transistor T6' are designed around the driving transistor T1', which occupy a certain amount of area. Compared with the related art techniques, since the second transistor T2, the third transistor T3, the fifth transistor T5, and the sixth transistor T6 in this embodiment are moved to the second pixel driving circuit layer 20, the active portion 2111 of the second transistor T2, the active portion 2112 of the third transistor T3, the active portion 2113 of the fifth transistor T5, and the active portion 2114 of the sixth transistor T6 can overlap with the capacitor Cst, thereby saving the area previously occupied by the second transistor T2, the third transistor T3, the fifth transistor T5, and the sixth transistor T6, i.e., the area occupied the entire pixel driving circuit can be reduced.

Figure 8:
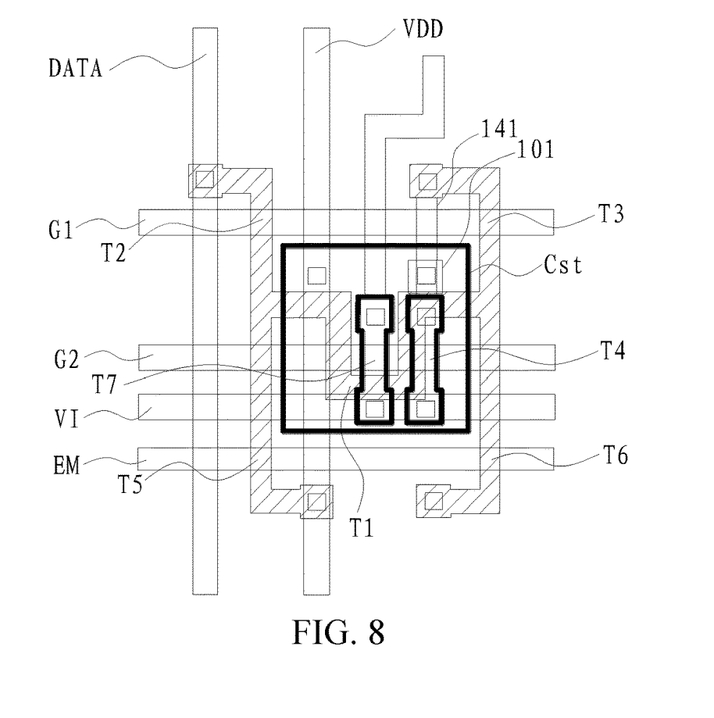
FIG. 8 is a diagram illustrating a plan view of a pixel driving circuit according to another embodiment of the present invention.

Please refer to FIG. 8, which is a diagram illustrating a plan view of a pixel driving circuit according to another embodiment of the present invention. In other embodiments, the fourth transistor T4 and the seventh transistor T7 receiving the same second driving signal Scan(n−1) can also be moved to the second pixel driving circuit layer 20. The second transistor T2, the third transistor T3, the fifth transistor T5 and the sixth transistor T6 can be arranged at the same layer in the first pixel driving circuit layer 10 with the first transistor T1. With this design, the active portion 1112 of the fourth transistor T4 and the active portion 1113 of the seventh transistor T7 can overlap with the capacitor Cst, and the plane area occupied by the pixel driving circuit can also be reduced.

Figure 9:
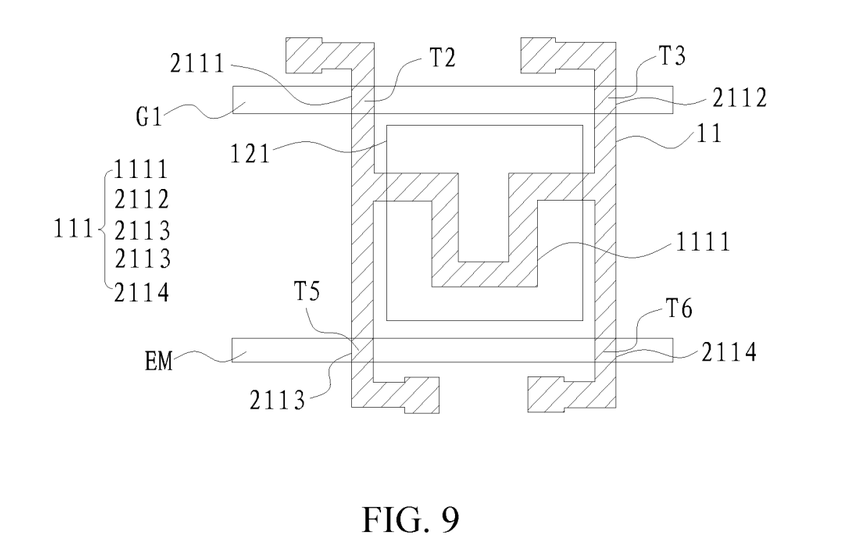
FIG. 9 is a diagram illustrating a plan view of film layers of a first semiconductor layer and first metal layer according to another embodiment of the present invention.
Figure 10:
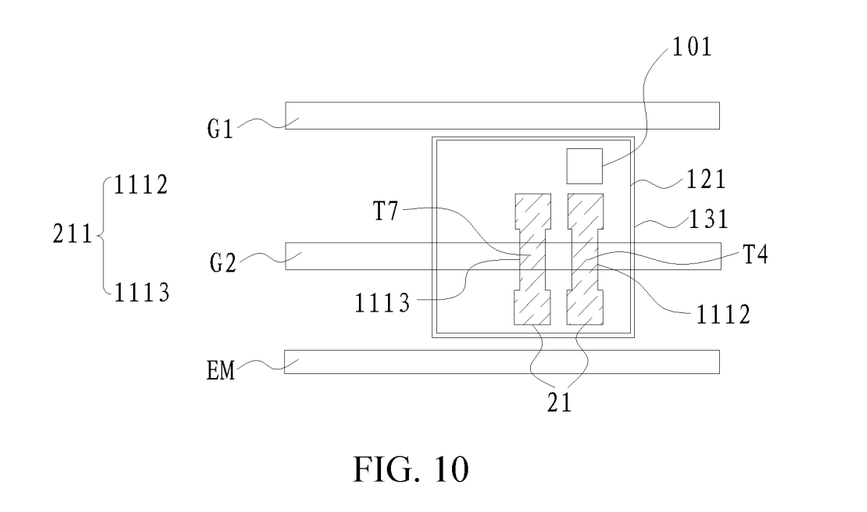
FIG. 10 is a diagram illustrating a plan view of film layers of a second semiconductor layer and capacitor according to another embodiment of the present invention.

Specifically, please refer to FIG. 9 and FIG. 10. FIG. 9 is a diagram illustrating a plan view of film layers of a first semiconductor layer and first metal layer according to another embodiment of the present invention. FIG. 10 is a diagram illustrating a plan view of film layers of a second semiconductor layer and capacitor according to another embodiment of the present invention. The first semiconductor layer 11 includes the first active portion 111 of the transistors in the first pixel driving circuit layer 10. The first active portion 111 includes the active portion 1111 of the first transistor T1, the active portion 2111 of the second transistor T2, the active portion 2112 of the third transistor T3, the active portion 2113 of the fifth transistor T5, and the active portion 2114 of the sixth transistor T6. The second semiconductor layer 21 includes a second active portion 211 including the active portion 1112 of the fourth transistor T4 and the active portion 1113 of the seventh transistor T7.

Referring to FIG. 10, the orthogonal projection of the active portion 1112 of the fourth transistor T4 on the horizontal plane and the orthogonal projection of the active portion 1113 of the seventh transistor T7 on the horizontal plane at least partially overlap with the orthogonal projection of the gate 121 on the horizontal plane, and/or the orthogonal projection of the active portion 1112 of the fourth transistor T4 on the horizontal plane and the orthogonal projection of the active portion 1113 of the seventh transistor T7 on the horizontal plane both at least partially overlap with the orthogonal projection of the gate 121 on the horizontal plane.

Preferably, the orthogonal projection of the second semiconductor layer 21 on the horizontal plane is within the orthogonal projection of the gate 121 on the horizontal plane, and/or the orthogonal projection of the second semiconductor layer 21 on the horizontal plane is within the orthogonal projection of the first electrode plate 131 on the horizontal plane, so as to minimize the plane area occupied by the pixel driving circuit.

As shown in FIGS. 2 and 8, the first electrode plate 131 includes vias 101 through which some of the transistors of the second pixel driving circuit layer 20 are electrically connected with the corresponding transistors of the first pixel driving circuit layer 10. Specifically, the electrical connection between the transistors of the upper and lower layers can be electrically connected by the first switching line 141, which electrically connects the transistors of the upper and lower layers at the vias 101. In other words, the first conversion line 141 electrically connects one of the source and drain of some of the transistors of the second pixel driving circuit layer 20 with one of the source and drain of the corresponding transistor of the first pixel driving circuit layer 10 through the via 101. As shown in FIG. 2, the first conversion line 141 electrically connects one of the source and drain of the fourth transistor T4 with one of the source and drain of the third transistor T3. As shown in FIG. 8, the first switching line 141 electrically connects one of the source and drain of the fourth transistor T4 with one of the source and drain of the third transistor T3.

Referring to FIG. 1, in this embodiment of the present invention, the type of transistors in the second pixel driving circuit layer 20 can be different from that in the first pixel driving circuit layer 10, so as to prevent the electrical properties of transistors in different layers from being affected. For example, the transistors in the first pixel driving circuit layer 10 may be low-temperature polysilicon thin film transistors, which are of a top-gate structure. Transistors in the second pixel driving circuit layer 20 may be amorphous silicon thin film transistors or indium gallium zinc oxide thin film transistors, etc., which may be of a bottom-gate structure, but the present invention is not limited thereto.

Further referring to FIG. 1, in the embodiment of the present invention, the second pixel driving circuit layer 20 is arranged on the first pixel driving circuit layer 10, the light emitting unit (not shown) is arranged on the second pixel driving circuit layer 20, and the first electrode plate 131 is arranged between the first semiconductor layer 11 and the second semiconductor layer 21.

The display panel 100 includes a third metal layer 22, a first source-drain layer 14, and a second source-drain layer 23 arranged in different layers. The third metal layer 22 includes gates of transistors in the second driving circuit layer 20. The first source-drain layer 14 includes sources and drains of transistors in the first driving circuit layer 10. The second source-drain layer 23 includes sources and drains of transistors in the second driving circuit layer 20. In some embodiments of the present invention, each metal layer may further include a signal line, and the location of the metal layer where the signal line is located depends on the film layers where the transistors of different functions are located.

Specifically, in the embodiments shown in FIGS. 2 to 4, the first metal layer 12 includes the gate 121 of the first transistor T1, and further includes the first signal line G2 for transmitting the second driving signal Scan(n−1). The second metal layer 13 includes the first electrode plate 131, and further includes a third voltage line VI. The third metal layer 22 further includes the second signal line G1 for transmitting the first driving signal Scan(n), that is, the gate of the second transistor T2 and the gate of the third transistor T3 in the second pixel driving circuit layer 20 are electrically connected to the second signal line G1. The third metal layer 22 further includes a third signal line EM for transmitting the third driving signal EM (n), that is, the gate of the fifth transistor T5 and the gate of the sixth transistor T6 in the second pixel driving circuit layer 20 are electrically connected to the third signal line EM. The second source-drain layer 23 further includes a second voltage line DATA and a first voltage line VDD.

In the embodiment shown in FIGS. 8 to 10, the first metal layer 12 includes a second signal line G1 for transmitting the first driving signal Scan(n) and a third signal line EM for transmitting the third driving signal EM(n). The third metal layer 22 further includes a first signal line G2 for transmitting the second driving signal Scan(n−1). That is, the gate of the fourth transistor T4 and the gate of the seventh transistor T7 in the second pixel driving circuit layer are electrically connected to the first signal line G2. The first source-drain layer 14 further includes a second voltage line DATA and a first voltage line VDD, and the second source-drain layer 23 further includes a third voltage line VI.

It can be understood that each metal layer, source-drain layer and semiconductor layer can be insulated by different insulating layers, and the insulating layers can be inorganic insulating layers to achieve the purpose of insulating while water and oxygen can also be blocked.

The electrical connection between the first pixel driving circuit layer 10 and the second pixel driving circuit layer 20 can be realized by the electrical connection between the second source-drain layer 23 and the first source-drain layer 14.

To sum up, the embodiment of the invention provides a display panel, which includes a plurality of light-emitting units and a plurality of pixel driving circuits for driving the light-emitting units to emit light. The pixel driving circuits include a first pixel driving circuit layer, a second pixel driving circuit layer, and a capacitor which are arranged in different layers. Each of the first pixel driving circuit layer and the second pixel driving circuit layer includes at least one transistor. The capacitor is electrically connected with one of the transistors of the first pixel driving circuit layer, and includes a first electrode plate electrically connected with a first voltage line. The second pixel driving circuit layer is arranged on the first electrode plate, and the orthogonal projection of the transistor of the second pixel driving circuit layer on the first electrode plate at least partially overlaps with the first electrode plate. The display panel not only saves the space occupied by the pixel driving circuit, but also shields crosstalk between transistors in upper and lower layers.

In the above embodiments, the description of each embodiment has its own emphasis. For the parts that are not detailed in one embodiment, please refer to the related descriptions of other embodiments.

The above embodiment of the present application provides a detailed description of a display panel, and specific examples are applied in this article to illustrate the principles and implementation of the present application. The above embodiment description is only used to help understand the method of the present application and its core ideas. Further, one skilled in the art can change or modify the above embodiments based on the main ideas of the present invention. Therefore, the exemplary contents in the specification should not be realized as a limitation of the scope of the present application.

What is claimed is:

1. A display panel, comprising:
a plurality of light emitting units; and
a plurality of pixel driving circuits for driving the plurality of light emitting units to emit light, comprising:
a first pixel driving circuit layer comprising at least one transistor;
a capacitor electrically connected to the at least one transistor of the first pixel driving circuit layer, and comprising a first electrode plate electrically connected to a first voltage line;
a second pixel driving circuit layer arranged on the capacitor, wherein the second pixel driving circuit layer comprises at least one transistor;
wherein an orthogonal projection of said at least one transistor of the second pixel driving circuit layer on the first electrode plate at least partially overlaps with the first electrode plate;
gates of transistors of the second pixel driving circuit layer are arranged on the first electrode plate, and at least some of the gates of the transistors of the second pixel driving circuit layer are electrically connected to a signal line; and
the first electrode plate comprises vias through which some of the transistors of the second pixel driving circuit layer are electrically connected with corresponding transistors of the first pixel driving circuit layer;
wherein the first pixel driving circuit layer comprises a first transistor, and the display panel comprises a first semiconductor layer, a first metal layer, a second metal layer, and a second semiconductor layer arranged in different layers;
wherein the first semiconductor layer comprises a first active portion of the at least one transistor of the first pixel driving circuit layer;
the second semiconductor layer comprises a second active portion of the at least one transistor of the second pixel driving circuit layer;
the first metal layer comprises a gate of the first transistor, and the gate of the first transistor doubles as a second electrode plate of the capacitor; and
the second metal layer comprises the first electrode plate, wherein an orthogonal projection of the gate on a horizontal plane at least partially overlaps with an orthogonal projection of the first electrode plate on the horizontal plane; and
wherein the orthogonal projection of the gate on the horizontal plane overlaps with an orthogonal projection of the second active portion on the horizontal plane, and/or the orthogonal projection of the first electrode plate on the horizontal plane partially overlaps with the orthogonal projection of the second active portion on the horizontal plane.

2. The display panel according to claim 1, wherein the orthogonal projection of the second active portion on the horizontal plane is within the orthogonal projection of the gate on the horizontal plane, and/or the orthogonal projection of the second active portion on the horizontal plane is within the orthogonal projection of the first electrode plate on the horizontal plane.

3. The display panel of claim 2, wherein an orthogonal projection of the first semiconductor layer on the horizontal plane partially overlaps with an orthogonal projection of the second semiconductor layer on the horizontal plane.

4. A display panel, comprising:
a plurality of light emitting units; and
a plurality of pixel driving circuits for driving the plurality of light emitting units to emit light, the pixel driving circuits comprising:
a first pixel driving circuit layer comprising at least one transistor;
a capacitor electrically connected to the at least one transistor of the first pixel driving circuit layer, and comprising a first electrode plate electrically connected to a first voltage line; and
a second pixel driving circuit layer arranged on the capacitor and electrically connected with the first pixel driving circuit layer, wherein the second pixel driving circuit layer comprises at least one transistor;
wherein an orthogonal projection of said at least one transistor of the second pixel driving circuit layer on the first electrode plate at least partially overlaps with the first electrode plate;
wherein the first pixel driving circuit layer comprises a first transistor, and the display panel comprises a first semiconductor layer, a first metal layer, a second metal layer, and a second semiconductor layer arranged in different layers;
wherein the first semiconductor layer comprises a first active portion of the at least one transistor of the first pixel driving circuit layer;
the second semiconductor layer comprises a second active portion of the at least one transistor of the second pixel driving circuit layer;
the first metal layer comprises a gate of the first transistor, and the gate of the first transistor doubles as a second electrode plate of the capacitor; and
the second metal layer comprises the first electrode plate, wherein an orthogonal projection of the gate on a horizontal plane at least partially overlaps with an orthogonal projection of the first electrode plate on the horizontal plane; and wherein the orthogonal projection of the gate on the horizontal plane partially overlaps with an orthogonal projection of the second active portion on the horizontal plane, and/or the orthogonal projection of the first electrode plate partially overlaps with the orthogonal projection of the second active portion on the horizontal plane.

5. The display panel according to claim 4, wherein the orthogonal projection of the second active portion on the horizontal plane is within the orthogonal projection of the gate on the horizontal plane, and/or the orthogonal projection of the second active portion on the horizontal plane is within the orthogonal projection of the first electrode plate on the horizontal plane.

6. The display panel of claim 5, wherein an orthogonal projection of the first semiconductor layer on the horizontal plane partially overlaps with an orthogonal projection of the second semiconductor layer on the horizontal plane.

7. The display panel according to claim 4, wherein the first electrode plate comprises a via through which some of transistors of the second pixel driving circuit layer are electrically connected with corresponding transistors of the first pixel driving circuit layer.

8. The display panel according to claim 7, further comprising a first conversion line, wherein the first conversion line electrically connects, through the via, one of a source and a drain of some of the transistors of the second pixel driving circuit layer to one of a source and a drain of the corresponding transistors of the first pixel driving circuit layer.

9. The display panel according to claim 4, wherein a gate of any one of the at least one transistor of the second pixel driving circuit layer is arranged on the first electrode plate, and at least some of gates of transistors of the second pixel driving circuit layer are electrically connected to a same signal line.

10. The display panel according to claim 9, wherein an orthogonal projection of the signal line electrically connecting to the gates of the transistors of the second pixel driving circuit layer on the first electrode plate partially overlaps with the first electrode plate.

11. The display panel of claim 9, wherein the pixel driving circuit further comprises a second transistor, a third transistor, a fourth transistor, a fifth transistor, a sixth transistor, and a seventh transistor, wherein both a gate of the second transistor and a gate of the third transistor receive a first driving signal, both a gate of the fourth transistor and a gate of the seventh transistor receive a second driving signal, both a gate of the fifth transistor and a gate of the sixth transistor receive a third driving signal, wherein one of a source and a drain of the second transistor is electrically connected to a first voltage line, the drain of the second transistor is electrically connected between one of a source and a drain of the fifth transistor and one of a source and a drain of the first transistor, the first electrode plate is electrically connected between the first voltage line and the other of the source and drain of the fifth transistor, one of a source and a drain of the third transistor is electrically connected between one of a source and a drain of the fourth transistor and the gate of the first transistor, the other of the source and drain of the third transistor is electrically connected between the other of the source and drain of the first transistor and one of a source and a drain of the sixth transistor, the other of the source and drain of the sixth transistor is electrically connected between an anode of one of the plurality of light emitting units and one of a source and a drain of the seventh transistor, and one of the source and drain of the fourth transistor is electrically connected between a third voltage line and the other of the source and drain of the seventh transistor.

12. The display panel according to claim 11, wherein the first active portion comprises an active portion of the first transistor, an active portion of the fourth transistor, and an active portion of the seventh transistor, and the second active portion comprises an active portion of the second transistor, an active portion of the third transistor, an active portion of the fifth transistor, and an active portion of the sixth transistor.

13. The display panel according to claim 12, wherein each of the orthogonal projections of the active portion of the second transistor on the horizontal plane, the active portion of the third transistor on the horizontal plane, the active portion of the fifth transistor on the horizontal plane, and the active portion of the sixth transistor on the horizontal plane at least partially overlaps with the orthogonal projection of the gate on the horizontal plane; and/or each of the orthogonal projections of the active portion of the second transistor, the active portion of the third transistor, the active portion of the fifth transistor, and the active portion of the sixth transistor on the horizontal plane overlaps at least partially with the orthogonal projection of the first electrode plate on the horizontal plane.

14. The display panel according to claim 12, wherein the first metal layer comprises a first signal line for transmitting the second driving signal, the second metal layer comprises the third voltage line, the display panel comprises a third metal layer, and the third metal layer comprises a second signal line for transmitting the first driving signal and a third signal line for transmitting the third driving signal.

15. The display panel according to claim 11, wherein the first active portion comprises an active portion of the first transistor, an active portion of the second transistor, an active portion of the third transistor, an active portion of the fifth transistor, and an active portion of the sixth transistor; and the second active portion comprises an active portion of the fourth transistor and an active portion of the seventh transistor.

16. The display panel according to claim 14, wherein both an orthogonal projection of the active portion of the fourth transistor on the horizontal plane and an orthogonal projection of the active portion of the seventh transistor on the horizontal plane at least partially overlap with the orthogonal projection of the gate on the horizontal plane, and/or both the orthogonal projection of the active portion of the fourth transistor on the horizontal plane and the orthogonal projection of the active portion of the seventh transistor on the horizontal plane at least partially overlap with the orthogonal projection of the first electrode plate on the horizontal plane.

17. The display panel according to claim 15, wherein an orthogonal projection of the second semiconductor layer on the horizontal plane is within the orthogonal projection of the gate on the horizontal plane, and/or the orthogonal projection of the second semiconductor layer on the horizontal plane is within the orthogonal projection of the first electrode plate on the horizontal plane.

18. The display panel of claim 15, wherein the first metal layer comprises a second signal line for transmitting the first driving signal, and a third signal line for transmitting the third driving signal, wherein the display panel comprises a third metal layer, and the third metal layer comprises the first signal line for transmitting the second driving signal.

* * * * *